(12) United States Patent
Zhang et al.

(10) Patent No.: US 10,985,069 B2
(45) Date of Patent: Apr. 20, 2021

(54) GATE STACK OPTIMIZATION FOR WIDE AND NARROW NANOSHEET TRANSISTOR DEVICES

(71) Applicant: INTERNATIONAL BUSINESS MACHINES CORPORATION, Armonk, NY (US)

(72) Inventors: Jingyun Zhang, Albany, NY (US); Takashi Ando, Tuckahoe, NY (US); Choonghyun Lee, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/815,627

(22) Filed: Mar. 11, 2020

(65) Prior Publication Data
US 2020/0211902 A1    Jul. 2, 2020

Related U.S. Application Data

(62) Division of application No. 16/047,838, filed on Jul. 27, 2018, now Pat. No. 10,643,899.

(51) Int. Cl.
*H01L 21/8234* (2006.01)
*H01L 27/088* (2006.01)
(Continued)

(52) U.S. Cl.
CPC ......... *H01L 21/823431* (2013.01); *H01L 21/823412* (2013.01); *H01L 21/823456* (2013.01);
(Continued)

(58) Field of Classification Search
CPC ..... H01L 21/823431; H01L 21/823456; H01L 21/823412; H01L 27/0886; H01L 29/7853;
(Continued)

(56) References Cited

U.S. PATENT DOCUMENTS 6,388,327 B1    5/2002  Giewont et al.
7,244,683 B2    7/2007  Chung et al.
(Continued)

OTHER PUBLICATIONS

Bao et al., "Replacement Metal Gate Resistance in FinFET Architecture Modelling, Validation and Extendibility", 2015 IEEE International Electron Devices Meeting (IEDM). Dec. 7-9, 2015. pp. 1-4.
(Continued)

*Primary Examiner* — Caleen O Sullivan
(74) *Attorney, Agent, or Firm* — Tutunjian & Bitetto, P.C.; L. Jeffrey Kelly

(57) ABSTRACT

A method of forming a nanosheet device is provided. The method includes forming a plurality of narrow nanosheets on a first region of a substrate, and forming a plurality of wide nanosheets on a second region of the substrate. The method further includes forming an interfacial layer on the plurality of narrow nanosheets and the plurality of wide nanosheets. The method further includes depositing a gate dielectric layer on the plurality of narrow nanosheets and the plurality of wide nanosheets. The method further includes depositing a dummy gate layer on the gate dielectric layer on the plurality of narrow nanosheets and the plurality of wide nanosheets. The method further includes forming a dummy cover layer on the dummy gate layer on the plurality of narrow nanosheets and the plurality of wide nanosheets.

18 Claims, 8 Drawing Sheets

(51) Int. Cl.
*H01L 29/78* (2006.01)
*H01L 29/66* (2006.01)
*H01L 29/06* (2006.01)

(52) U.S. Cl.
CPC ...... *H01L 27/0886* (2013.01); *H01L 29/0673* (2013.01); *H01L 29/66545* (2013.01); *H01L 29/7853* (2013.01)

(58) Field of Classification Search
CPC ........... H01L 29/0673; H01L 29/66545; H01L 29/775; H01L 29/66439; H01L 29/78696; H01L 29/42392; H01L 27/088; B82Y 10/00
USPC ........................................................ 257/401
See application file for complete search history.

(56) References Cited

U.S. PATENT DOCUMENTS

| | | |
|---|---|---|
| 9,620,590 B1 | 4/2017 | Bergendahl et al. |
| 9,741,822 B1 | 8/2017 | Jagannathan et al. |
| 9,799,748 B1 | 10/2017 | Xie et al. |
| 9,947,804 B1 * | 4/2018 | Frougier ........... H01L 29/78696 |
| 10,002,939 B1 * | 6/2018 | Cheng ................... H01L 29/511 |
| 2006/0131555 A1 | 6/2006 | Liu et al. |
| 2008/0067566 A1 | 3/2008 | Choi et al. |

OTHER PUBLICATIONS

Loubet et al., "Stacked Nanosheet Gate-All-Around Transistor to Enable Scaling Beyond FinFET", 2017 Symposium on VLSI Technology. Digest of Technical Papers. Jun. 5-8, 2017. pp. 1-2.

Park et al., "A New ALD-TiN/CoSi2 Contact Plug Process for Reliable and Low Defect Density Bit-Line Integration in Sub-Quarter Micron Giga-bit DRAM", Proceedings of the IEEE 2002 International Interconnect Technology Conference. Jun. 5, 2002. pp. 1-3.

List of IBM Patents or Patent Applications Treated as Related dated Mar. 11, 2020, 2 pages.

\* cited by examiner

_(1)_

GATE STACK OPTIMIZATION FOR WIDE AND NARROW NANOSHEET TRANSISTOR DEVICES

BACKGROUND

Technical Field

The present invention generally relates to nanosheet devices, and more particularly to fabricating nanosheet devices having improved gate properties.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a method of forming a nanosheet device is provided. The method includes forming a plurality of narrow nanosheets on a first region of a substrate, and forming a plurality of wide nanosheets on a second region of the substrate. The method further includes forming an interfacial layer on the plurality of narrow nanosheets and the plurality of wide nanosheets. The method further includes depositing a gate dielectric layer on the plurality of narrow nanosheets and the plurality of wide nanosheets. The method further includes depositing a dummy gate layer on the gate dielectric layer on the plurality of narrow nanosheets and the plurality of wide nanosheets. The method further includes forming a dummy cover layer on the dummy gate layer on the plurality of narrow nanosheets and the plurality of wide nanosheets.

In accordance with another embodiment of the present invention, a method of forming a nanosheet device is provided. The method includes forming a plurality of narrow nanosheets on a first region of a substrate, and forming a plurality of wide nanosheets on a second region of the substrate. The method further includes forming an interfacial layer on each of the plurality of narrow nanosheets and the plurality of wide nanosheets, wherein the interfacial layer is a semiconductor oxide. The method further includes depositing a gate dielectric layer on the plurality of narrow nanosheets and the plurality of wide nanosheets. The method further includes depositing a dummy gate layer on the gate dielectric layer on the plurality of narrow nanosheets and the plurality of wide nanosheets. The method further includes forming a dummy cover layer on the dummy gate layer on the plurality of narrow nanosheets and the plurality of wide nanosheets, wherein the dummy cover layer is the same material as the dummy gate layer.

In accordance with yet another embodiment of the present invention, a nanosheet device is provided. The nanosheet device includes a plurality of narrow nanosheets on a first region of a substrate and a plurality of wide nanosheets on a second region of the substrate, wherein adjacent narrow nanosheets of the plurality of narrow nanosheets on the first region of a substrate and the adjacent wide nanosheets of the plurality of wide nanosheets on the second region of a substrate are separated by a distance, $D_1$, in a range of about 5.5 nm to about 17.5 nm. The nanosheet device further includes an interfacial layer on the plurality of narrow nanosheets and the plurality of wide nanosheets. The nanosheet device further includes a gate dielectric layer on the plurality of narrow nanosheets and the plurality of wide nanosheets, and a conductive gate layer on the gate dielectric layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a gate-all-around structure on nanosheet devices that provides improved electrostatic control of the gates for further reduced device dimensions.

Embodiments of the present invention provide nanosheet devices with different nanosheet widths on different regions of a substrate with controlled gate dielectric quality. Sidewall and top nanosheet gate dielectric quality can be maintained through controlled formation and removal of a blocking layer that avoids pinching off spaces between nanosheets having widths greater than 50 nanometers.

Embodiments of the present invention provide a method of improving a gate stack quality by annealing a blocking layer and dummy gate structure on the nanosheets of nanosheet devices.

Exemplary applications/uses to which the present invention can be applied include, but are not limited to: digital; logic devices (e.g., NAND and NOR gates) using nanosheet transistor devices, and memory devices (e.g., dynamic random access memory (DRAM) devices, and static random access memory (SRAM) devices) using nanosheet transistor devices.

It is to be understood that aspects of the present invention will be described in terms of a given illustrative architecture; however, other architectures, structures, substrate materials and process features and steps can be varied within the scope of aspects of the present invention.

Figure 1:
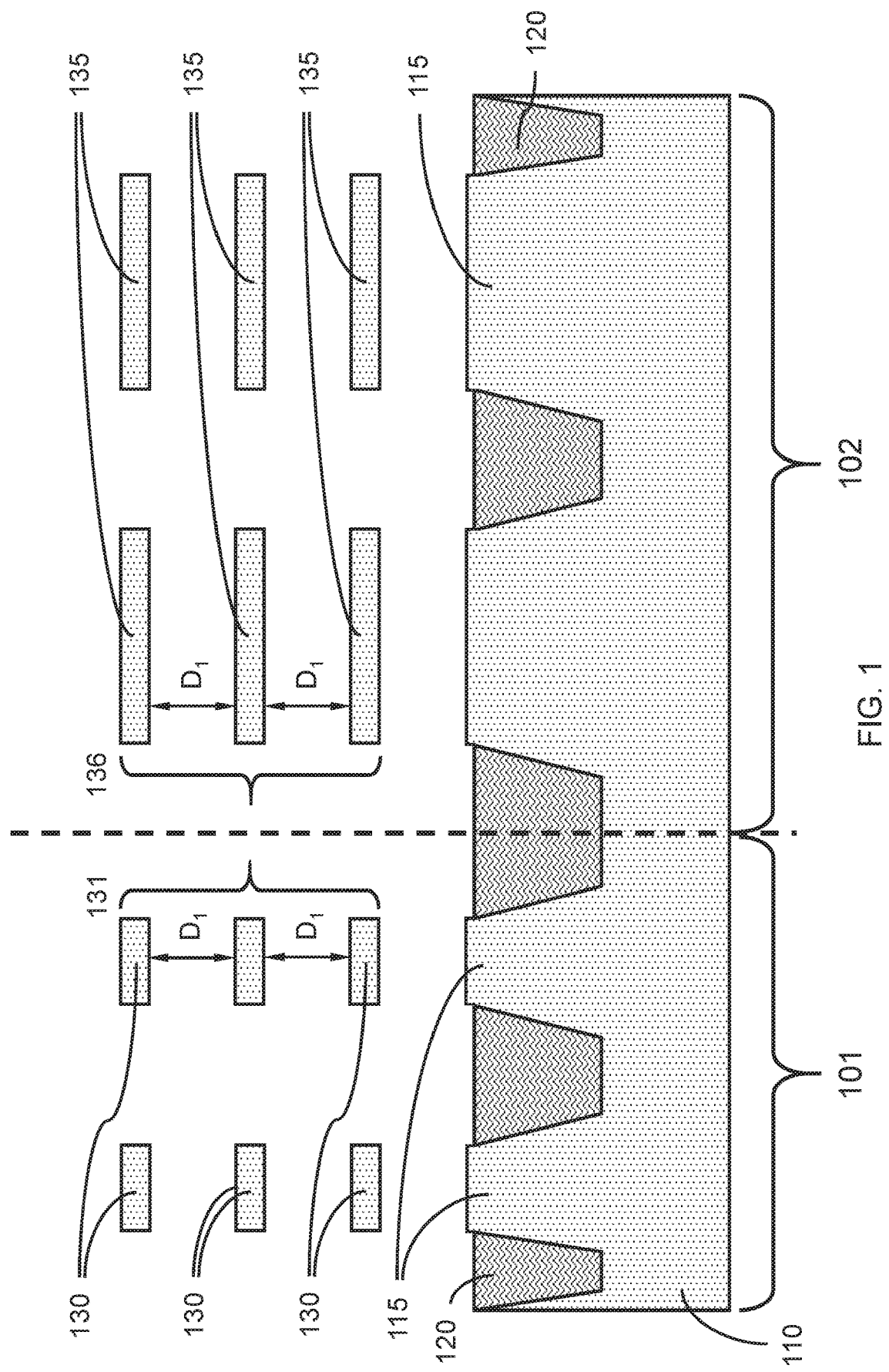
FIG. 1 is a cross-sectional side view showing stacks of nanosheets of different sizes on different regions of the substrate, where adjacent stacks of nanosheets are separated by isolation regions, in accordance with an embodiment of the present invention.

Referring now to the drawings in which like numerals represent the same or similar elements and initially to FIG. 1, a cross-sectional side view of stacks of nanosheets of different sizes on different regions of the substrate, where adjacent stacks of nanosheets are separated by isolation regions, is shown, in accordance with an embodiment of the present invention.

In one or more embodiments, stacks of nanosheets can be formed on a substrate 110, where different stacks 131, 136 of nanosheets 130, 135 on different regions 101, 102 of the substrate 110 can have different sizes. Adjacent vertical stacks 131, 136 of nanosheets 130, 135 can be separated by isolation regions 120 formed in the substrate 110. A vertical stack 131 of narrow nanosheets 130 can be formed on a first region 101 of the substrate 110, and a vertical stack 136 of wide nanosheets 135 can be formed on a second region 102 of the substrate adjacent to the first region 101 of the substrate. The wide nanosheets can have a width greater than the narrow nanosheets by about 35 nanometers (nm) to about 110 nm, or about 50 nm to about 75 nm, although other differences in width are also contemplated.

In various embodiments, a plurality of narrow nanosheets 130 and a plurality of wide nanosheets 135 can be formed by epitaxial growth of alternating sacrificial layers and nanosheet layers on the substrate 110. The alternating sacrificial layers and nanosheet layers can be cut using a directional etching process to form alternating sacrificial layer segments and nanosheets 130, 135. Source/drain regions can be formed on opposite ends of the sacrificial layer segments and nanosheets. The sacrificial layer segments can be removed to leave nanosheets 130, 135 supported between the source/drain regions. In various embodiments, the source/drain regions can be doped semiconductor material and the nanosheets can be intrinsic semiconductor material.

In various embodiments, the narrow nanosheets 130 can have a width of about 10 nm to about 25 nm, or about 15 nm to about 20 nm, although other widths are also contemplated.

In various embodiments, the wide nanosheets 135 can have a width of about 60 nm to about 120 nm, or about 75 nm to about 100 nm, although other widths are also contemplated.

In various embodiments, the nanosheets 130, 135 can be separated by a distance, $D_1$, in a range of about 5.5 nanometers (nm) to about 17.5 nm or about 7 nm to about 13 nm, or about 10 nm, where the distance, $D_1$, can be determined by the thickness of the sacrificial layers formed on the substrate. The distance, $D_1$, between the wide nanosheets 135 can be the same as the distance, $D_1$, between the narrow nanosheets 130.

In various embodiments, the nanosheets 130, 135 can have a thickness in a range of about 3 nm to about 10 nm, or about 5 nm to about 8 nm, although other thicknesses are also contemplated. The narrow nanosheets 130 can have the same thickness as the wide nanosheets 135, where the nanosheet thicknesses can be determined by the thickness of the nanosheet layers.

In one or more embodiments, a substrate 110 can be, for example, a single crystal semiconductor material wafer or a semiconductor-on-insulator stacked wafer. The substrate 110 can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)), or an implanted layer can form a buried insulating material.

The support layer can include crystalline, semi-crystalline, micro-crystalline, nano-crystalline, and/or amorphous phases. The support layer can be a semiconductor (e.g., silicon (Si), silicon carbide (SiC), silicon-germanium (SiGe), germanium (Ge), gallium-arsenide (GaAs), cadmium-telluride (CdTe), etc.), an insulator (e.g.: glass (e.g. silica, borosilicate glass), ceramic (e.g., aluminum oxide ($Al_2O_3$, sapphire), plastic (e.g., polycarbonate, polyacetonitrile), metal (e.g. aluminum, gold, titanium, molybdenum-copper (MoCu) composites, etc.), or combination thereof.

The substrate 110 or active semiconductor layer can be a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a IV-VI semiconductor (e.g., tin sulfide (SnS), lead selenide (PbSb)). The nanosheets 130, 135 can be made of the same material as the substrate 110 or active semiconductor layer.

In various embodiments, isolation trenches can be formed in the substrate 110 and filled with a dielectric material, for example, silicon oxide (SiO) or a low-k dielectric material, to form isolation region(s) 120 in the substrate. A low-k dielectric can include, but not be limited to, carbon doped silicon oxide (SiO:C), fluorine doped silicon oxide (SiO:F), polymeric material, for example, tetraethyl orthosilicate (TEOS), hydrogen silsesquioxane (HSQ) and methylsilsesquioxane (MSQ), and combinations thereof. The dielectric material can be formed by a blanket deposition, for example, spin-on, and etched back to form the isolation regions 120 in the isolation trenches.

In various embodiments, the isolation region(s) 120 can be flush (i.e., co-planar) with the top surface of the substrate 110. In various embodiments, the isolation region(s) 120 can be below the top surface of the substrate, where the isolation trenches and top surface of the isolation region(s) 120 can form raised mesa(s) 115 below the nanosheets 130, 135. The raised mesa(s) 115 can have a height above the top surfaces of the isolation region(s) 120 in a range of greater than 0 nm to about 5 nm, or about 2 nm to about 4 nm.

The source/drains can be a crystalline semiconductor material, including, but not limited to, silicon (Si), silicon carbide (SiC), silicon-germanium (SiGe), and germanium (Ge), that can include a dopant. The dopant can be an n-type dopant (e.g., phosphorus (P), arsenic (As)) or p-type dopant (e.g., boron (B), gallium (Ga)). The dopant can be introduced into the source/drains during formation (i.e., in situ) and/or after formation (i.e., ex situ), for example, through ion implantation, plasma doping, gas phase doping, solid phase doping, liquid phase doping.

Figure 2:
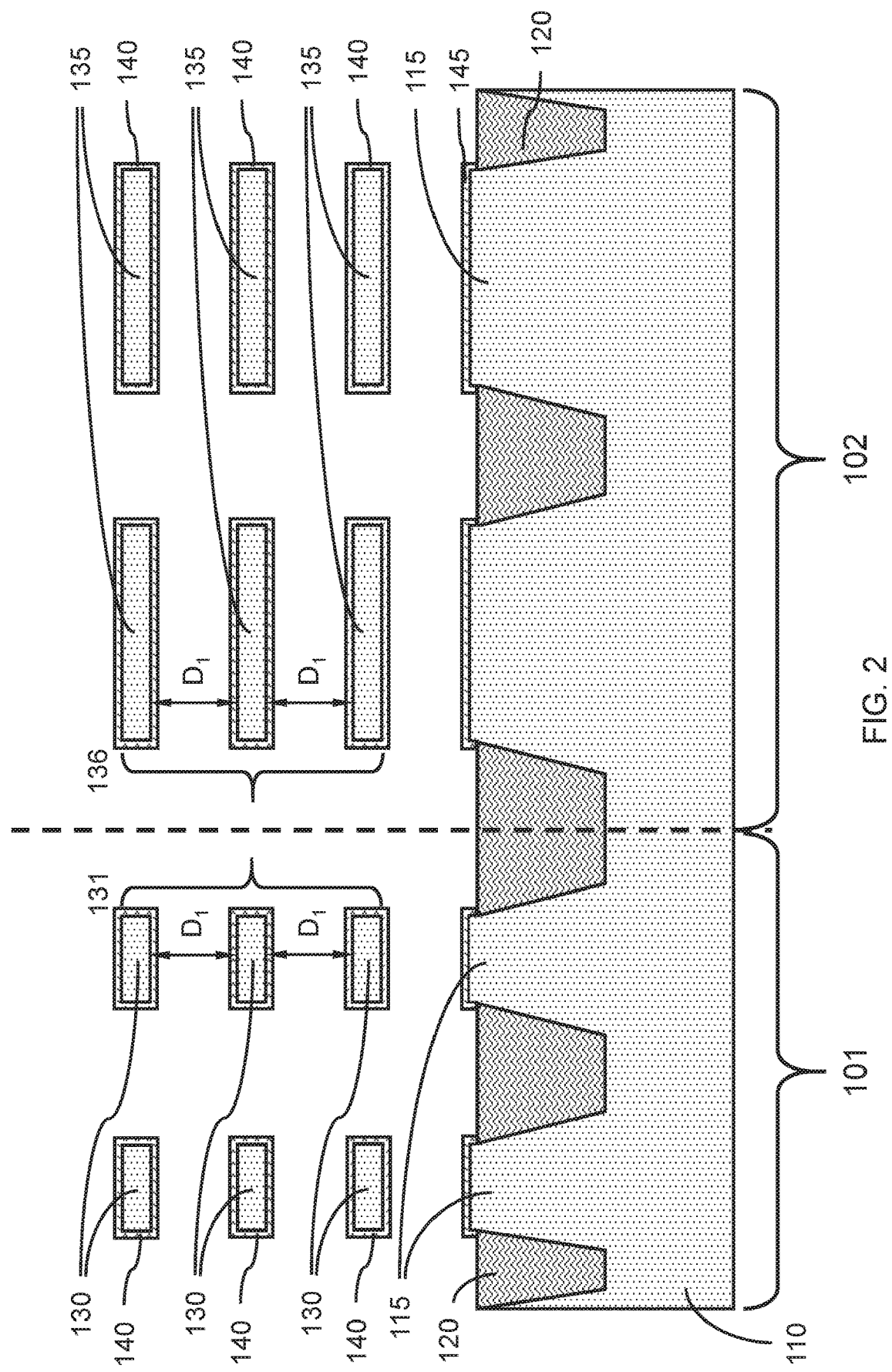
FIG. 2 is a cross-sectional side view showing an interfacial layer on the nanosheets and substrate mesas, in accordance with an embodiment of the present invention.

FIG. 2 is a cross-sectional side view showing an interfacial layer on the nanosheets and substrate mesas, in accordance with an embodiment of the present invention.

In one or more embodiments, an interfacial layer 140 can be formed on the exposed surfaces of each of the nanosheets 130, 135, where the interfacial layer 140 can be around four sides of the nanosheets 130, 135. An interfacial layer cap 145 can be formed on the exposed surfaces of the substrate mesas 115. The interfacial layers 140 and interfacial layer caps 145 can be formed by a thermal oxidation of the nanosheets 130, 135 and raised mesa(s) 115, or by a conformal deposition, for example atomic layer deposition (ALD), plasma enhanced ALD (PEALD), or a combination thereof, where the interfacial layers 140 can be formed to a controlled thickness on the bottom surfaces, sidewalls, and shadowed surfaces of the nanosheets 130, 135. The interfacial layers 140 and interfacial layer caps 145 can be formed at low temperatures, where the interfacial layers 140 and interfacial layer caps 145 do not have optimized material densities.

In various embodiments, the interfacial layers 140 and interfacial layer caps 145 can be made of an oxide of the semiconductor material forming the nanosheets 130, 135, or a silicon oxide (SiO) deposited on the nanosheets 130, 135, where the silicon oxide can be silicon dioxide ($SiO_2$).

In various embodiments, the interfacial layers 140 and interfacial layer caps 145 can have a thickness in a range of about 0.5 nm to about 2 nm, or about 1 nm, although other thicknesses are also contemplated. In various embodiments, the thickness of the interfacial layers 140 and interfacial layer caps 145 can fill in a portion of the gap between the nanosheets 130, 135 to reduce the distance between the opposing surfaces.

Figure 3:
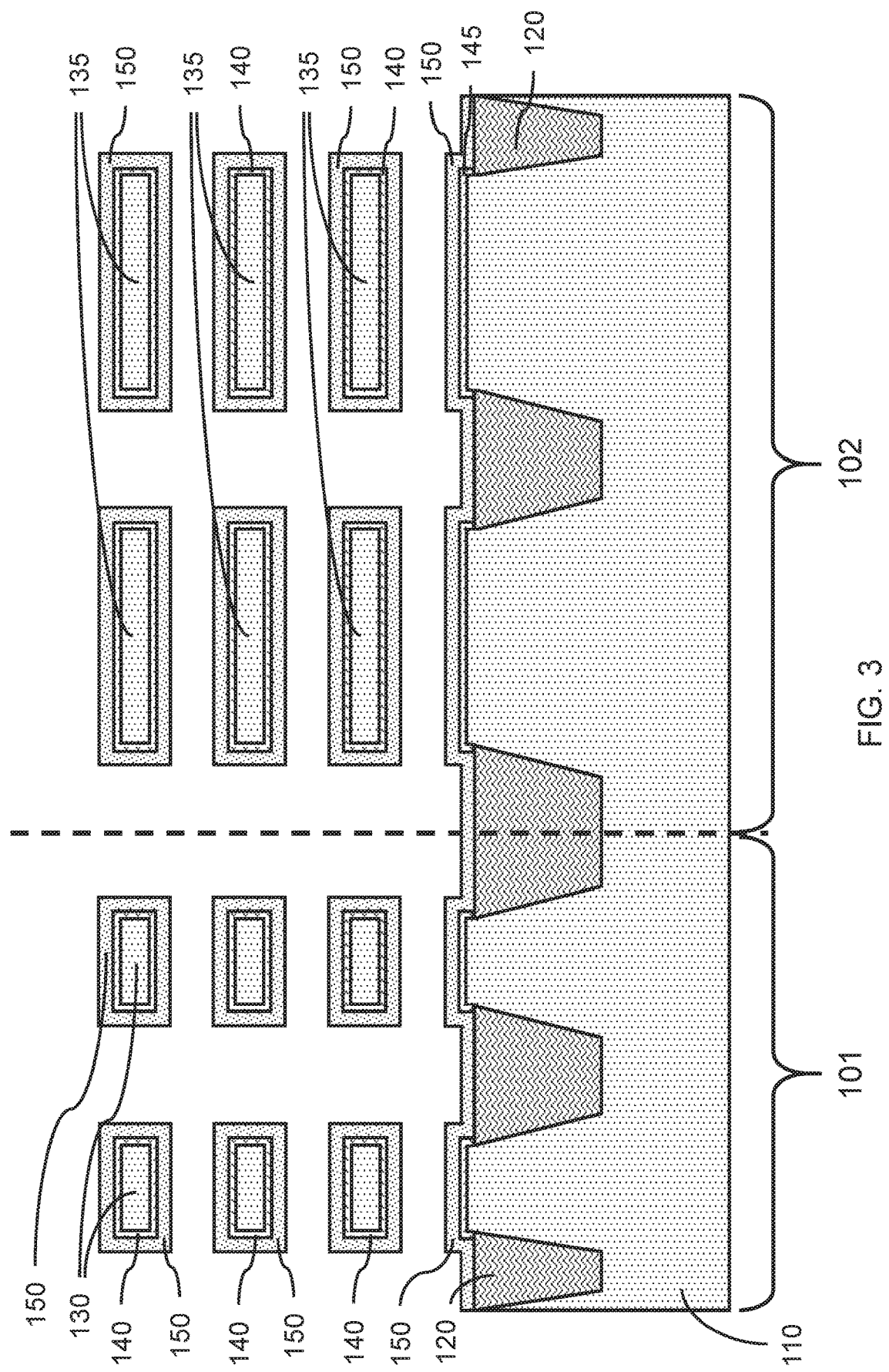
FIG. 3 is a cross-sectional side view showing a gate dielectric layer formed on the interfacial layer and isolation regions, in accordance with an embodiment of the present invention.

FIG. 3 is a cross-sectional side view showing a gate dielectric layer formed on the interfacial layer and isolation regions, in accordance with an embodiment of the present invention.

In one or more embodiments, a gate dielectric layer 150 can be formed on the interfacial layers 140, and on the interfacial layer caps 145 where the gate dielectric layer 150 can be formed by a conformal deposition (e.g., ALD, PEALD). The gate dielectric layer 150 can be around four sides of the nanosheets 130, 135. The gate dielectric layer 150 can be formed on the surfaces of the isolation region(s) 120.

In various embodiments, the gate dielectric layer 150 can be a dielectric material, including, but not limited to, silicon oxide (SiO), silicon nitride (SiN), silicon oxynitride (SiON), silicon boronitride (SiBN), silicon boro carbonitride (SiBCN), silicon carbonitride (SiCN), silicon oxycarbonitride (SiOCN), a high-k dielectric, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer 150 can have a thickness in a range of about 1 nm to about 3 nm, or about 2 nm, although other thicknesses are also contemplated.

Figure 4:
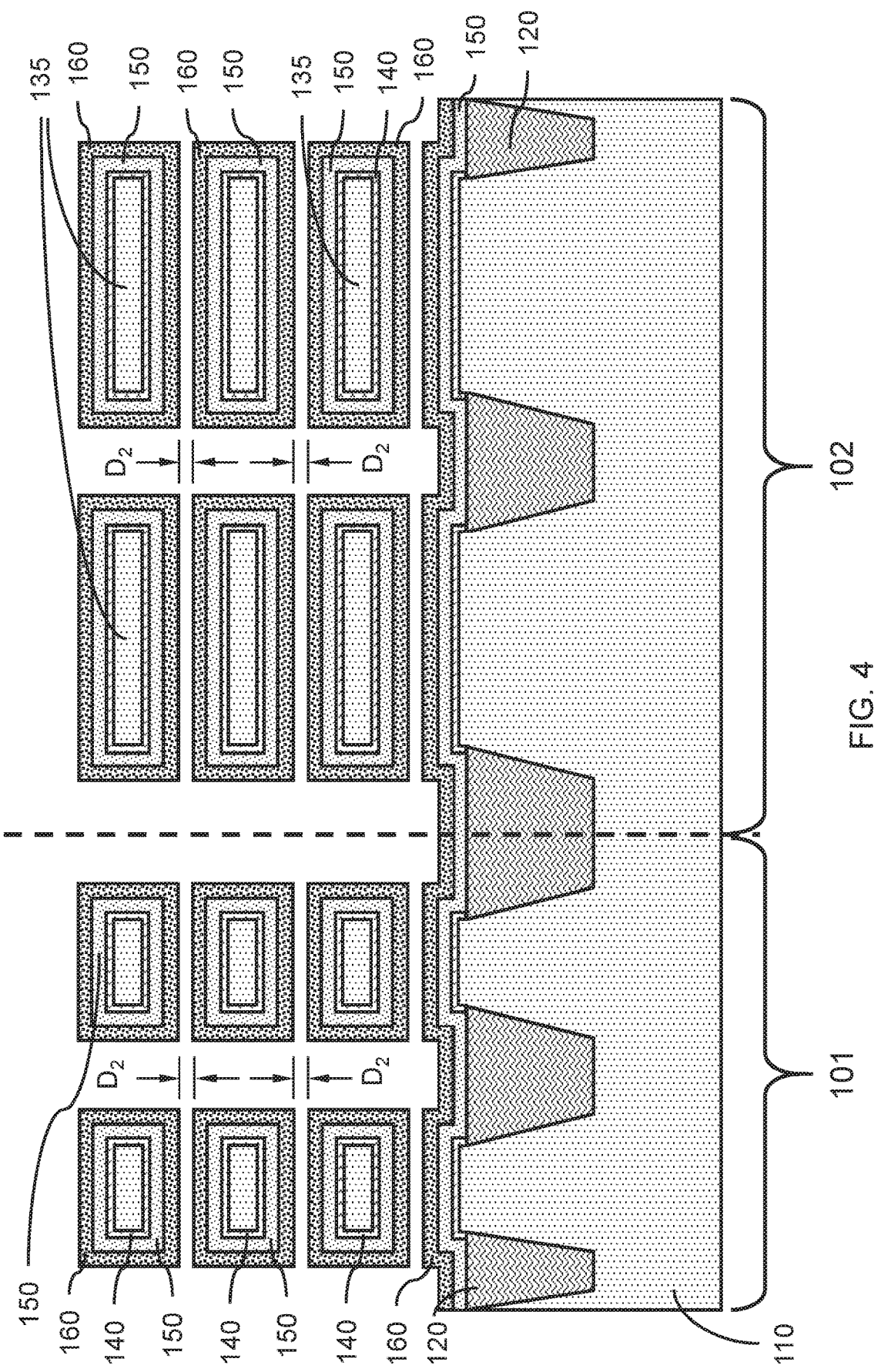
FIG. 4 is a cross-sectional side view showing a dummy gate layer on the gate dielectric layer, in accordance with an embodiment of the present invention.

FIG. 4 is a cross-sectional side view showing a dummy gate layer on the gate dielectric layer, in accordance with an embodiment of the present invention.

In one or more embodiments, a dummy gate layer 160 can be formed on the gate dielectric layer 150, where the dummy gate layer 160 can be formed by a conformal deposition (e.g., ALD, PEALD). The dummy gate layer 160 can be around four sides of the gate dielectric layer 150 on both the narrow nanosheets 130 and wide nanosheets 135.

In various embodiments, the dummy gate layer 160 can be a metal nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), or combinations thereof, where the dummy gate layer 160 can be selectively removed relative to the gate dielectric layer 150.

In various embodiments, the dummy gate layer 160 can have a thickness in a range of about 1 nm to about 3 nm, or about 1.5 nm to about 2 nm, although other thicknesses are also contemplated. The dummy gate layer can have the same thickness on both the narrow nanosheets 130 and wide nanosheets 135.

In various embodiments, the opposing surfaces of the dummy gate layer 160 can be separated by a distance, $D_2$, in a range of about 0.5 nm to about 1.5 nm or about 1 nm. The distance, $D_2$, between the facing surfaces of the dummy gate layer 160 on adjacent narrow nanosheets 130 can be the same as the distance between the facing surfaces of the gate dielectric layer 150 on adjacent wide nanosheets 135.

In various embodiments, a portion of the dummy gate layer 160 can be formed on the gate dielectric layer 150 and isolation regions 120 between the different stacks 131, 136 of nanosheets 130, 135 on different regions 101, 102 of the substrate 110.

Figure 5:
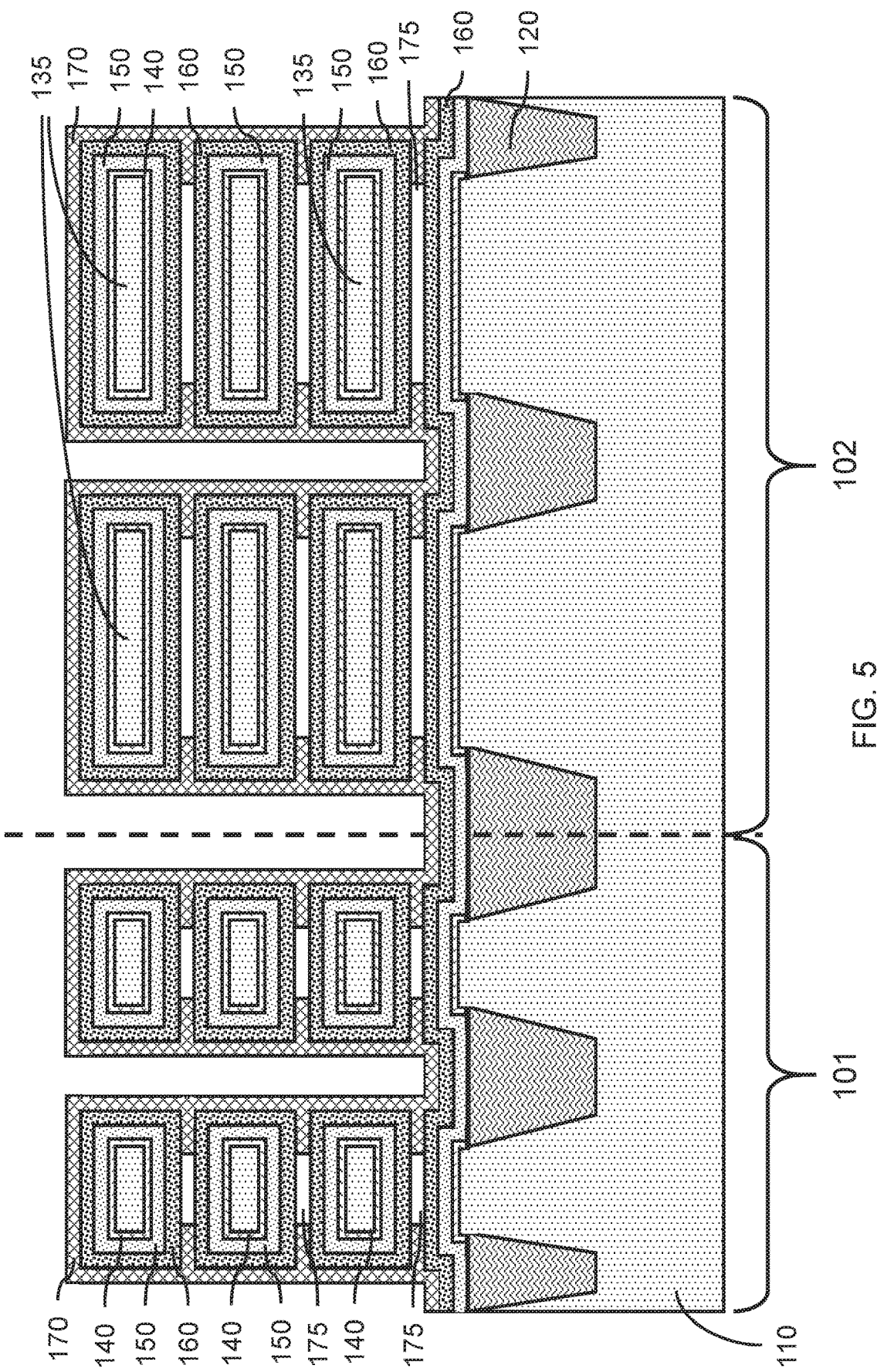
FIG. 5 is a cross-sectional side view showing a dummy cover layer formed on the dummy gate layer, in accordance with an embodiment of the present invention.

FIG. 5 is a cross-sectional side view showing a dummy cover layer formed on the dummy gate layer, in accordance with an embodiment of the present invention.

In one or more embodiments, a dummy cover layer 170 can be formed on the dummy gate layer 160, where the dummy cover layer 170 can be formed by a non-conformal isotropic deposition, for example, chemical vapor deposition (CVD), plasma enhanced CVD (PECVD), metal-organic CVD (MOCVD), or combinations thereof, where the deposition processes pinches off the gap between the opposing surfaces of the dummy gate layer 160 to form void spaces 175 between adjacent nanosheets 130, 135, or the raised mesa(s) 115 and an adjacent bottom nanosheet 130, 135. The void spaces 175 can leave a portion of the opposing surfaces of the dummy gate layer 160 uncovered.

The dummy cover layer 170 can be formed to a depth into the gap between the opposing surfaces of the dummy gate layer 160, where the depth of the pinch-off portion can be determined by the separation distance, $D_2$.

In various embodiments, a portion of the dummy cover layer 170 can be formed on the dummy gate layer 160 and isolation regions 120 between the different stacks 131, 136 of nanosheets 130, 135 on different regions 101, 102 of the substrate 110.

In one or more embodiments, the dummy cover layer 170 can be a metal nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), or combinations thereof, where the dummy cover layer 170 can be the same material as the dummy gate layer 160.

Figure 6:
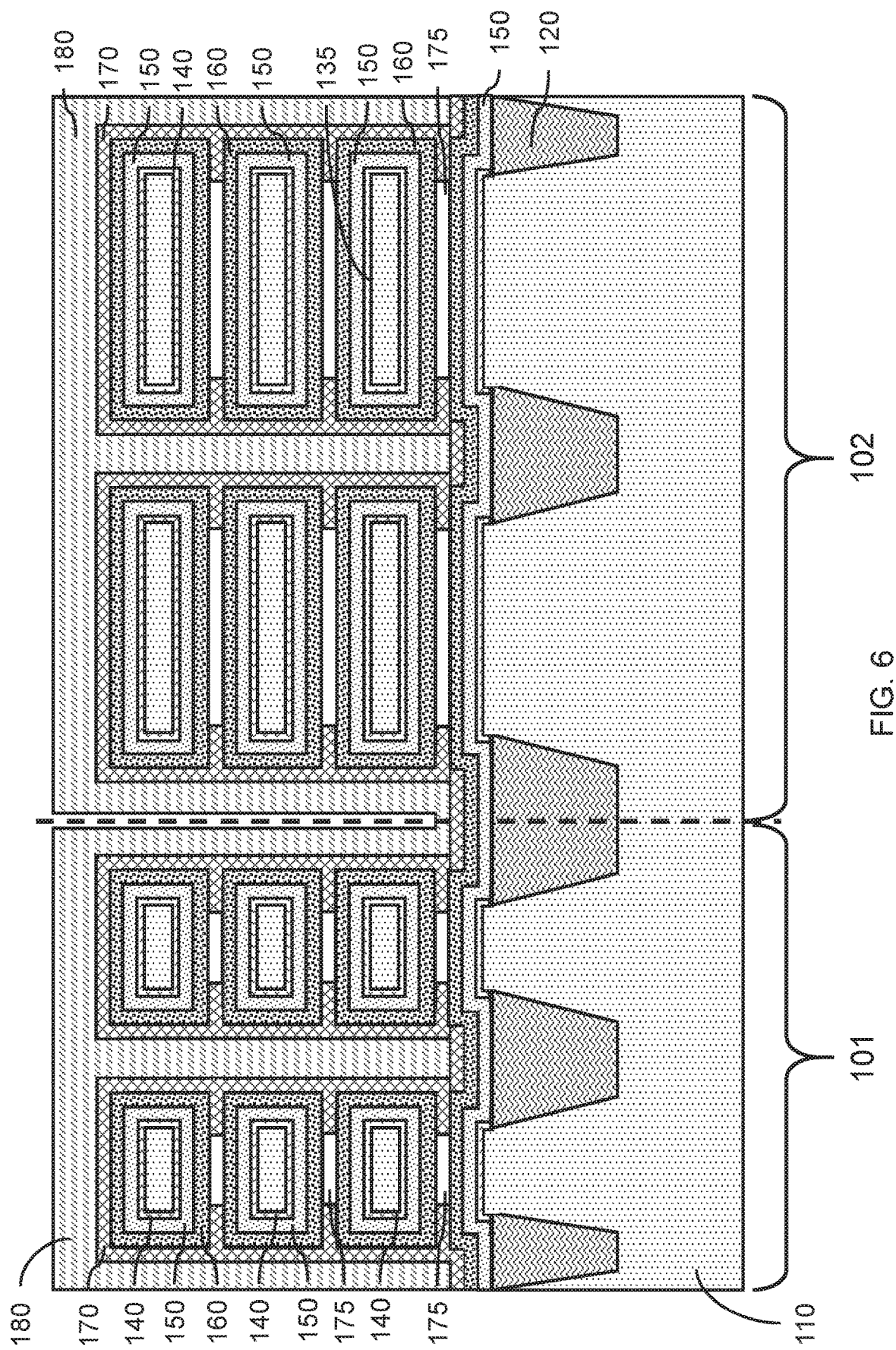
FIG. 6 is a cross-sectional side view showing a blocking layer on the dummy cover layer and dummy gate layer for heat treatment, in accordance with an embodiment of the present invention.

FIG. 6 is a cross-sectional side view showing a blocking layer on the dummy cover layer and dummy gate layer for heat treatment, in accordance with an embodiment of the present invention.

In one or more embodiments, a blocking layer 180 can be formed on the dummy cover layer 170 and dummy gate layer 160, where the blocking layer 180 can be formed by an isotropic deposition (e.g., ALD, PEALD, CVD, PECVD, etc.), to cover the dummy cover layer 170 and different stacks 131, 136 of nanosheets 130, 135 on different regions 101, 102 of the substrate.

In various embodiments, the blocking layer 180 can be made of a material that can prevent oxygen ($O_2$) from penetrating to the underlying layers, including, but not limited to, amorphous silicon (a-Si), silicon nitride (SiN), silicon boronitride (SiBN), silicon carbonitride (SiCN), and combinations thereof. In various embodiments, the blocking layer 180 is not made of silicon oxide (SiO) or amorphous carbon (a-C).

In one or more embodiments, the blocking layer 180, dummy cover layer 170, dummy gate layer 160, gate dielectric layer 150, interfacial layers 140 and interfacial layer caps 145, and stacks 131, 136 of nanosheets 130, 135 can be heat treated to improve the gate stack quality. The material of the gate dielectric layer 150, interfacial layers 140 and interfacial layer caps 145 can be modified by the heat treatment, where the gate dielectric layer 150, interfacial layers 140 and interfacial layer caps 145 can be densified by the heat treatment. The heat treatment can be a furnace anneal, spike anneal, flash anneal, laser spike anneal, and combinations thereof. The heat treatment can be conducted at a temperature in a range of about 850° C. to about 1100° C., or about 900° C. to about 1010° C., although other temperatures are also contemplated. The heat treatment can be conducted for a duration of about 100 nanoseconds (nanosec) to about 1 millisecond (millisec), or about 1 sec to about 5 sec, although other durations are also contemplated, where the duration is sufficient to increase the thickness of the interfacial layer 140 by about 1 Å to about 4 Å, or about 2 Å to about 3 Å, and improve the quality of the interfacial layer 140 and gate dielectric layer 150 by increasing the density of gate dielectric layer 150, interfacial layers 140 and interfacial layer caps 145. The heat treatment can be conducted in a controlled atmosphere, where the amount of oxygen can be controlled to avoid increasing the thickness of interfacial layers 140 and interfacial layer caps 145 to a value at which device performance would be degraded.

Figure 7:
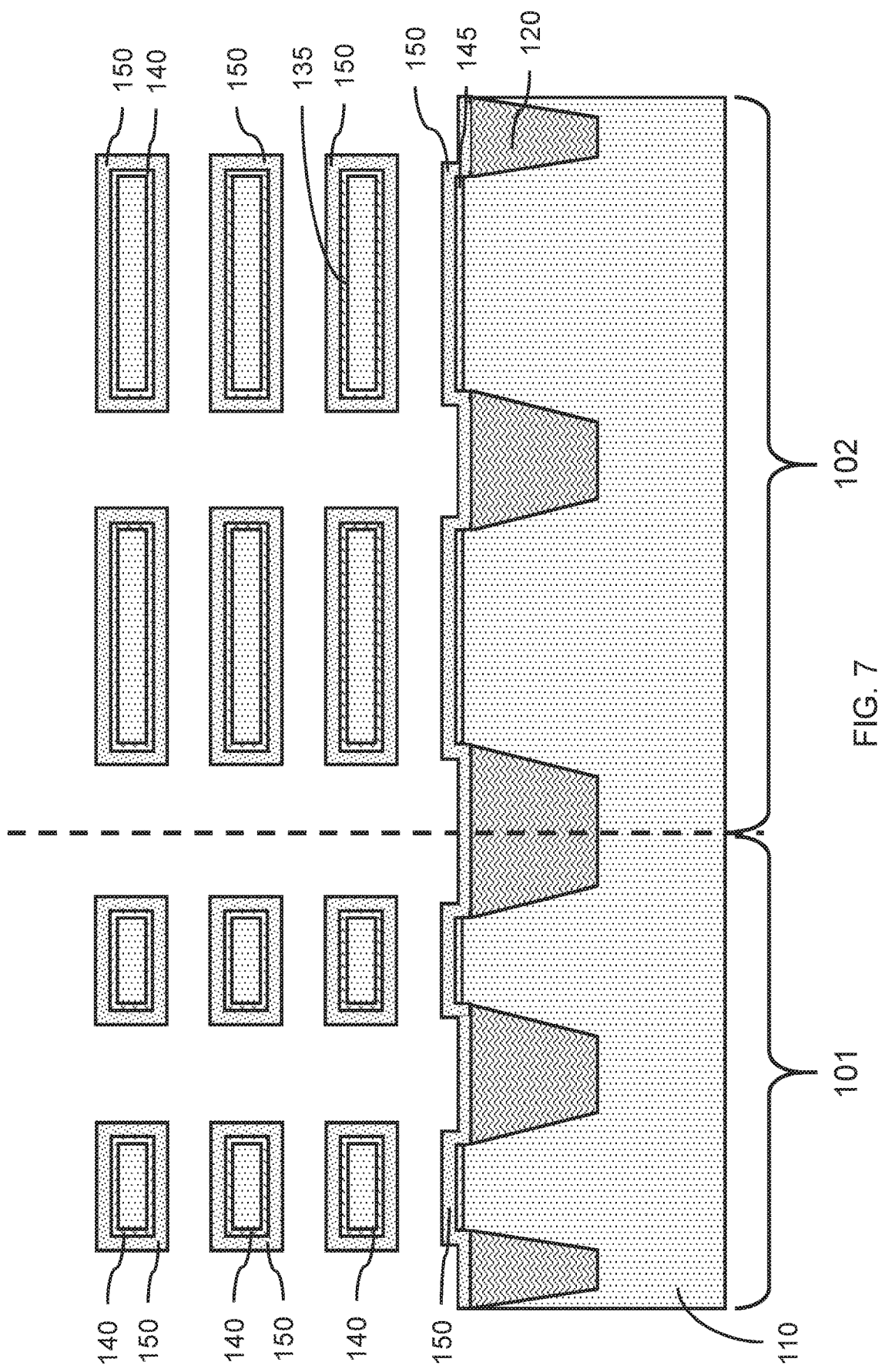
FIG. 7 is a cross-sectional side view showing the gate dielectric layer exposed after removing the blocking layer, the dummy cover layer, and the dummy gate layer, in accordance with an embodiment of the present invention.

FIG. 7 is a cross-sectional side view showing the gate dielectric layer exposed after removing the capping layer, the dummy cover layer, and the dummy gate layer, in accordance with an embodiment of the present invention.

In one or more embodiments, the blocking layer 180 can be removed using a selective isotropic etch, for example, a wet chemical etch, a dry plasma etch, or a combination thereof. Removal of the blocking layer 180 can expose the dummy cover layer 170.

In various embodiments, the dummy cover layer 170 and dummy gate layer 160 can be removed using a selective isotropic etch, for example, a wet chemical etch, a dry plasma etch, or a combination thereof. The dummy cover layer 170 and dummy gate layer 160 can be removed at the same time using the same etch, where the dummy cover layer 170 and dummy gate layer 160 are made of the same material. Removal of the dummy cover layer 170 and dummy gate layer 160 can expose the underlying gate dielectric layer 150. Removal of the dummy cover layer 170 can open up the void spaces 175 between adjacent nanosheets 130, 135, or the raised mesa(s) 115 and an adjacent nanosheet 130, 135.

Figure 8:
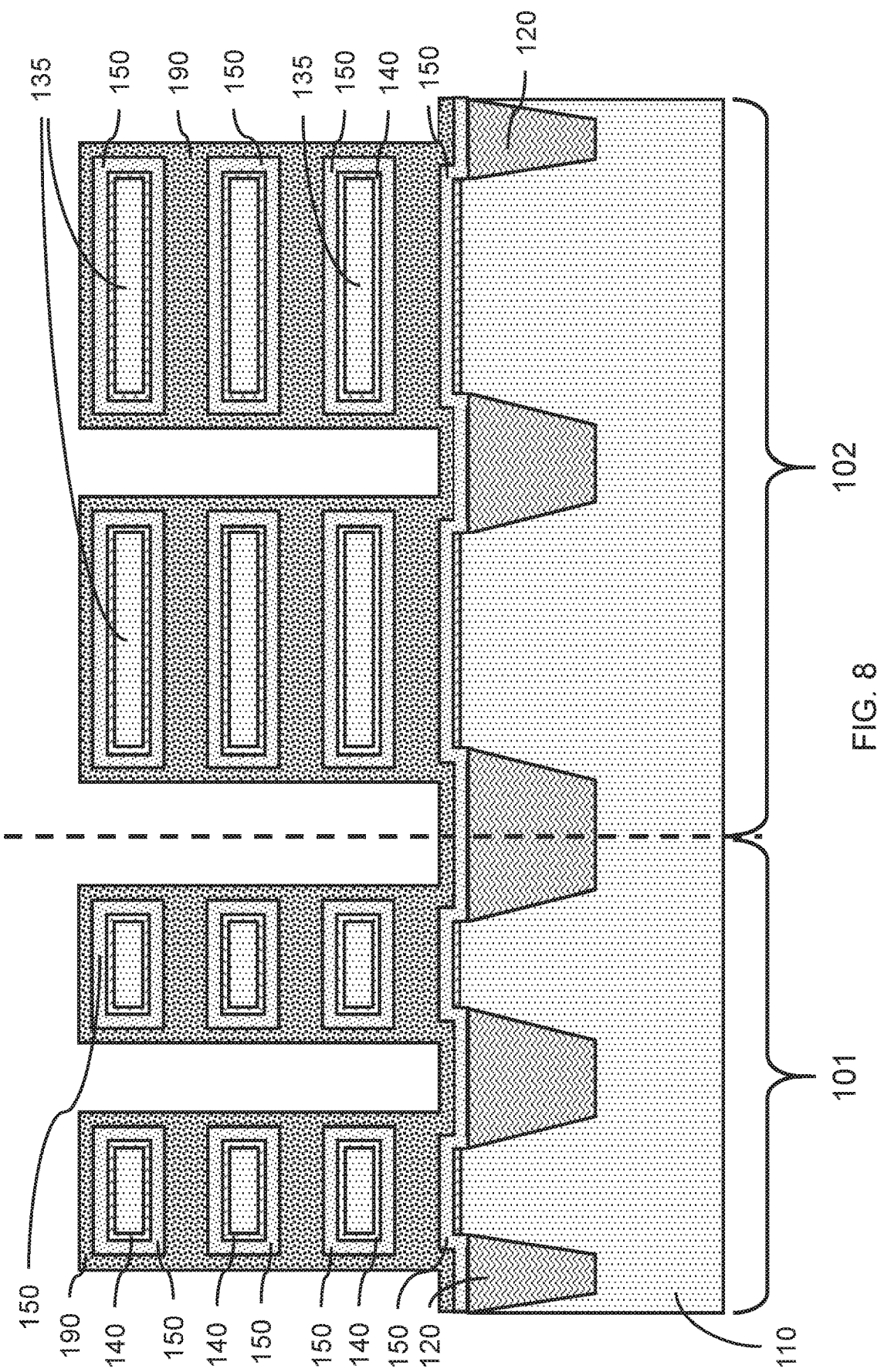
FIG. 8 is a cross-sectional side view showing a conductive gate layer formed on the gate dielectric layer and substrate, in accordance with an embodiment of the present invention.

FIG. 8 is a cross-sectional side view showing a conductive gate layer formed on the gate dielectric layer and substrate, in accordance with an embodiment of the present invention.

In one or more embodiments, a conductive gate layer 190 can be formed on the gate dielectric layer 150, isolation regions 120, and substrate 110, where the conductive gate layer 190 can be formed by a conformal deposition (e.g., ALD, PEALD) that fills in the gaps between adjacent nanosheets 130, 135, or the raised mesa(s) 115 and an adjacent nanosheet 130, 135.

In various embodiments, the conductive gate layer 190 can be a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, or any suitable combination of these materials.

In various embodiments, the conductive gate layer 190 may further comprise dopants that are incorporated during or after deposition. In some embodiments, the gate may further comprise a work function setting layer between the gate dielectric layer 150 and conductive gate layer 190. The work function setting layer can be a work function metal (WFM) can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both the conductive gate layer 190 and the WFM layer.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating a device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A nanosheet device, comprising:
a plurality of narrow nanosheets on a first region of a substrate;
a plurality of wide nanosheets on a second region of the substrate, wherein the wide nanosheets are wider than the narrow nanosheets, and wherein adjacent narrow nanosheets of the plurality of narrow nanosheets on the first region of a substrate and adjacent wide nanosheets of the plurality of wide nanosheets on the second region of a substrate are separated by a distance, $D_1$;

a raised mesa below each of the plurality of narrow nanosheets and plurality of wide nanosheets;

an interfacial layer on the plurality of narrow nanosheets and the plurality of wide nanosheets;

an interfacial layer cap on each of the raised mesas;

a gate dielectric layer on the plurality of narrow nanosheets and the plurality of wide nanosheets; and a conductive gate layer on the gate dielectric layer.

2. The nanosheet device of claim 1, wherein adjacent narrow nanosheets of the plurality of narrow nanosheets on the first region of a substrate and the adjacent wide nanosheets of the plurality of wide nanosheets on the second region of a substrate are separated by a distance, $D_1$, in a range of about 5.5 nm to about 17.5 nm.

3. The nanosheet device of claim 1, wherein the interfacial layer is silicon oxide (SiO).

4. The nanosheet device of claim 3, wherein the gate dielectric layer is selected from the group of materials consisting of silicon nitride (SiN), silicon oxynitride (SiON), silicon boronitride (SiBN), silicon boro carbonitride (SiBCN), silicon carbonitride (SiCN), silicon oxycarbonitride (SiOCN), high-k dielectrics, and combinations thereof.

5. The nanosheet device of claim 4, further comprising an isolation region in the substrate between the raised mesas.

6. The nanosheet device of claim 5, further comprising a portion of the conductive gate layer is on each isolation region.

7. The nanosheet device of claim 5, wherein the plurality of narrow nanosheets have a width of about 10 nanometers (nm) to about 25 nm.

8. The nanosheet device of claim 7, wherein the plurality of wide nanosheets have a width of about 60 nm to about 120 nm.

9. A nanosheet device, comprising:
a plurality of narrow nanosheets forming a first stack on a first region of a substrate;
a plurality of wide nanosheets forming a second stack on a second region of the substrate, wherein the wide nanosheets are wider than the narrow nanosheets, and wherein adjacent narrow nanosheets of the plurality of narrow nanosheets on the first region of a substrate and adjacent wide nanosheets of the plurality of wide nanosheets on the second region of a substrate are separated by a distance, $D_1$;
a first raised mesa below the first stack of narrow nanosheets and a second raised mesa below the second stack of wide nanosheets
an interfacial layer on the plurality of narrow nanosheets and the plurality of wide nanosheets;
an interfacial layer cap on each of the first and second raised mesas;
a gate dielectric layer on the plurality of narrow nanosheets and the plurality of wide nanosheets; and
a conductive gate layer on the gate dielectric layer.

10. The nanosheet device of claim 9, further comprising an isolation region in the substrate between the raised mesas.

11. The nanosheet device of claim 10, wherein the plurality of narrow nanosheets have a width of about 10 nanometers (nm) to about 25 nm.

12. The nanosheet device of claim 11, wherein the plurality of wide nanosheets have a width of about 60 nm to about 120 nm.

13. The nanosheet device of claim 12, wherein the interfacial layer is silicon oxide (SiO).

14. A nanosheet device, comprising:
a plurality of narrow nanosheets on a first region of a substrate;
a plurality of wide nanosheets each having a width greater than 50 nanometers on a second region of the substrate, wherein adjacent narrow nanosheets of the plurality of narrow nanosheets on the first region of a substrate and the adjacent wide nanosheets of the plurality of wide nanosheets on the second region of a substrate are separated by a distance, $D_1$, in a range of about 5.5 nm to about 17.5 nm;
a raised mesa below each of the plurality of narrow nanosheets and plurality of wide nanosheets;
an interfacial layer on the plurality of narrow nanosheets and the plurality of wide nanosheets;
a gate dielectric layer on the plurality of narrow nanosheets and the plurality of wide nanosheets; and
a conductive gate layer on the gate dielectric layer.

15. The nanosheet device of claim 14, wherein the plurality of narrow nanosheets have a width of about 10 nanometers (nm) to about 25 nm.

16. The nanosheet device of claim 15, wherein the plurality of wide nanosheets have a width of about 60 nm to about 120 nm.

17. The nanosheet device of claim 16, wherein the plurality of narrow nanosheets forms at least one vertical stack with a raised mesa below each stack of narrow nanosheets, and wherein the plurality of wide nanosheets forms at least another vertical stack with a raised mesa below each stack of wide nanosheets.

18. The nanosheet device of claim 17, further comprising an interfacial layer cap on each of the raised mesas, and an isolation region formed in the substrate between the one vertical stack and the other vertical stack.

* * * * *